United States Patent
Fritzinger et al.

[11] Patent Number: 5,945,355
[45] Date of Patent: Aug. 31, 1999

[54] INTEGRATED CIRCUIT FABRICATION

[75] Inventors: Larry Bruce Fritzinger; Taeho Kook; Kuo-Hua Lee, all of Orlando, Fla.

[73] Assignee: Lucent Technologies Inc., Murray Hill, N.J.

[21] Appl. No.: 08/871,383

[22] Filed: Jun. 9, 1997

[51] Int. Cl.[6] ............................................. H01L 21/00
[52] U.S. Cl. ............................................. 438/734; 438/743
[58] Field of Search .............................. 438/639, 712, 438/719, 723, 734, 733, 735, 743; 216/2, 79, 67

[56] References Cited

U.S. PATENT DOCUMENTS

| | | | |
|---|---|---|---|
| 4,377,438 | 3/1983 | Moriya et al. | 438/743 X |
| 4,484,978 | 11/1984 | Keyser . | |
| 4,585,517 | 4/1986 | Stemple | 438/712 X |
| 4,732,658 | 3/1988 | Lee | 438/743 X |
| 5,776,835 | 7/1998 | Yeh et al. | 438/712 |
| 5,783,496 | 7/1998 | Flanner et al. | 438/734 X |

*Primary Examiner*—William Powell
*Attorney, Agent, or Firm*—Anthony Grillo

[57] ABSTRACT

A novel process for forming a window, illustratively, an emitter window BiCMOS process is disclosed. An anisotropic etch followed by an isotropic etch to open the window is disclosed. The isotropic etch prevents contamination of the substrate by the anisotropic etching process.

6 Claims, 4 Drawing Sheets

INTEGRATED CIRCUIT FABRICATION

TECHNICAL FIELD

This invention relates, in general, to semiconductor integrated circuit technology and, in an illustrative embodiment, to integrated circuits which include both bipolar and MOSFET devices.

BACKGROUND OF THE INVENTION

Many modern integrated circuits utilize both bipolar and MOSFET (e.g. CMOS, NMOS, or PMOS) devices on a single chip. Such integrated circuits (when they combine bipolar and CMOS) are often termed "BiCMOS". Fabrication of BiCMOS (or even BiNMOS or BiPMOS) integrated circuits poses special problems for the process designer because certain process steps (e.g., heating, deposition, etching, etc.) which may facilitate the formation of, for example, improved bipolar devices, may adversely effect the formation of effective MOS devices.

Those concerned with the development of integrated circuit technology have consistently sought improved methods of integrated circuit fabrication.

SUMMARY OF THE INVENTION

The present invention illustratively includes:

forming a gate upon a substrate;

forming a blanket dielectric layer upon the gate and the substrate;

performing a blanket anisotropic etching process upon the dielectric layer, thereby removing a portion of the dielectric layer;

forming a patterned resist upon the dielectric; and isotropically etching the dielectric using the patterned resist as a mask, thereby exposing the substrate.

DETAILED DESCRIPTION

Figure 1:
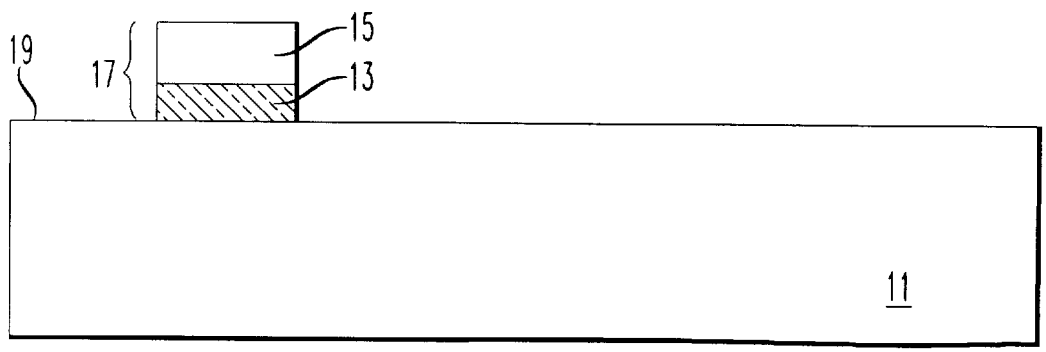
FIGS. 1–10 are cross-sectional views of a partially-fabricated integrated circuit formed according to illustrative embodiments of the present invention.

Turning to FIG. 1, reference numeral 11 denotes a substrate which may be typically, silicon, doped silicon, epitaxial silicon, etc. It may be assumed that appropriate field oxides or other isolation structures have already been formed (although they are not shown). Such isolations may serve, for example, to separate n-wells and p-wells for NMOS and PMOS devices (in a BiCMOS circuit) and/or also to separate the subsequently formed bipolar devices.

Gate 17 having conductor 15 and underlying gate dielectric 13 is defined by methods known to those of skill in the art. FIG. 1 illustrates that upper surface 19 of substrate 11 is bare except for the presence of gate 17. However, in practice, a small thickness of gate dielectric material may remain upon upper surface 19 of substrate 11.

Figure 2:
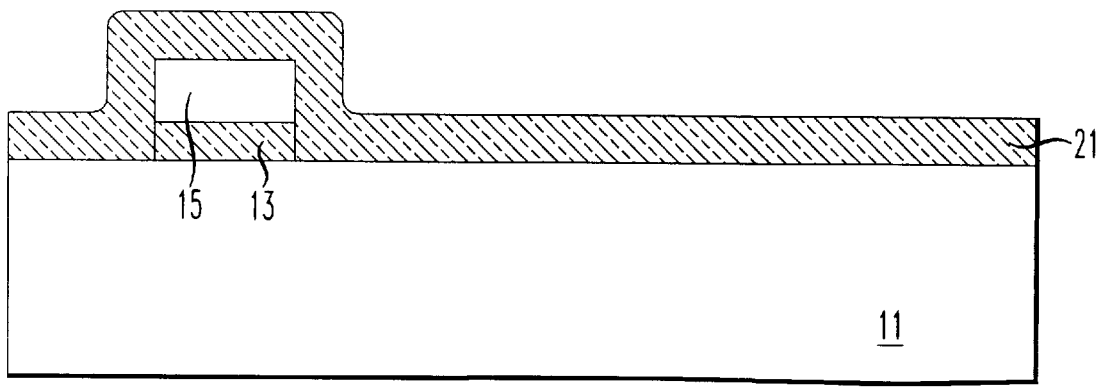

Turning to FIG. 2, a blanket layer of dielectric 21 is deposited. Illustratively, dielectric 21 may be an oxide of silicon, illustratively formed from TEOS or plasma enhanced TEOS (PETEOS). A thickness of nominally 1600 Å for dielectric 21 has proven suitable in a modern BiCMOS product. Dielectric 21 should have a thickness adequate for forming spacers adjacent gate 17. Thus, one of ordinary skill in the art may choose other thicknesses for dielectric 21 depending upon the height of gate 17.

Figure 3:
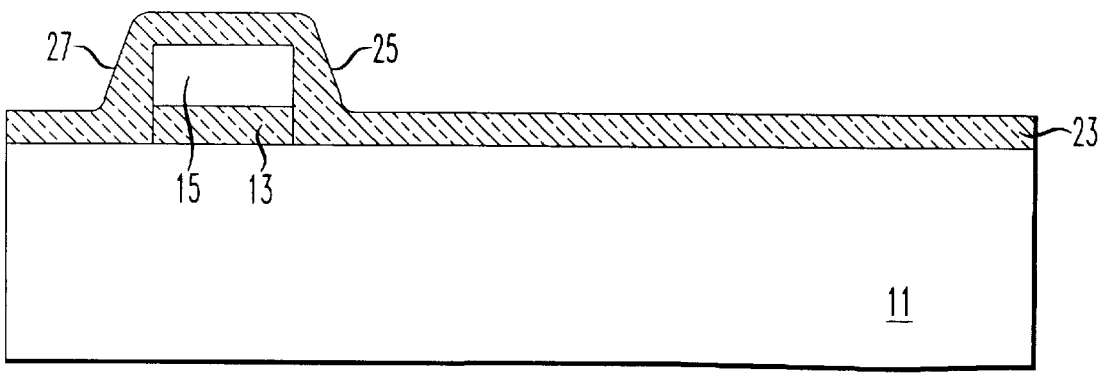

In FIG. 3, dielectric 21 has been partially etched by an anisotropic plasma etch. Illustratively, should the initial thickness of dielectric 21 be approximately 1600 Å, approximately 1000 Å of dielectric may be removed by an anisotropic etch, leaving nominally 600 Å of dielectric, denoted by reference numeral 23, remaining. It will be noted that the anisotropic etching process partially forms spacers 25 and 27 adjacent gate 17.

Figure 4:
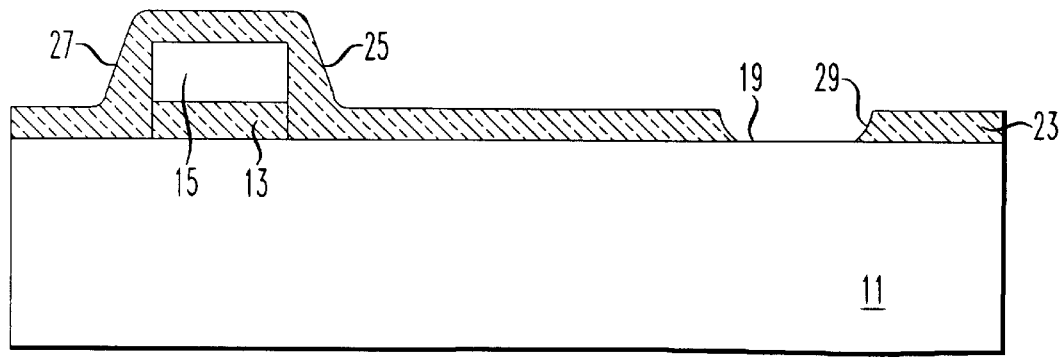

Turning to FIG. 4, dielectric 23 is patterned with a wet etching solution, illustratively comprising HF, to open a window 29 for a bipolar device emitter. It is assumed collector and base regions (not depicted) have already been formed in substrate 11 beneath window 29. Alternatively, the base may be formed through window 29 by ion implantation at this point.

Thus, it will noted that an opening 29, suitable for assisting in the definition of a bipolar emitter has been formed by a process which includes a first anisotropic etch and a second isotropic etch. Prior practice included the use of an anisotropic etch alone to define an emitter window. Applicant's process is advantageous because silicon substrate surface 19 which is exposed during emitter window formation is not subjected to the plasma etch. Consequently, there is no plasma induced damage of upper surface 19 of substrate 11. The plasma etch process forms a carbon fluoride residue upon upper surface 19. The presence of the carbon fluoride residue contributes to undesirably high polysilicon emitter contact resistance. Furthermore, the plasma etch introduces hydrogen and other species into substrate 11 as contaminants. Applicant's inventive process eliminates these disadvantages by not exposing upper surface 19 to the harmful effects of a plasma etch.

Figure 5:
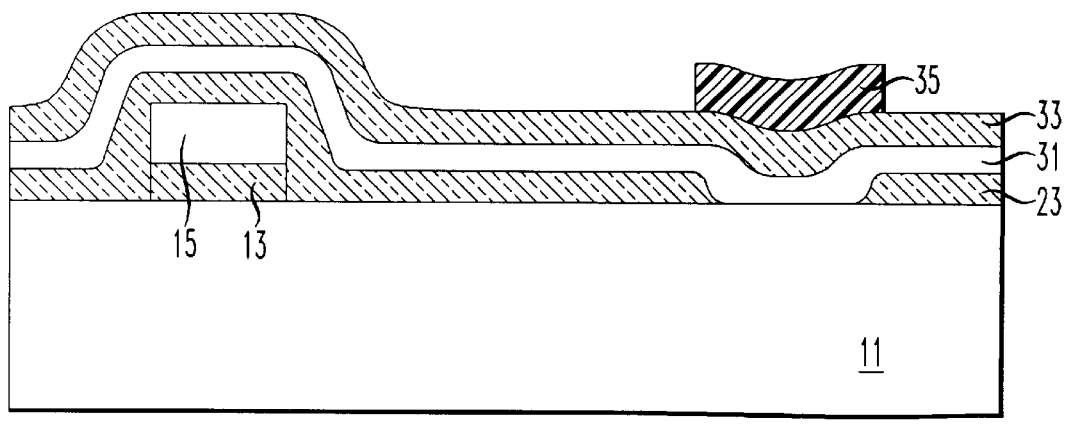
Figure 6:
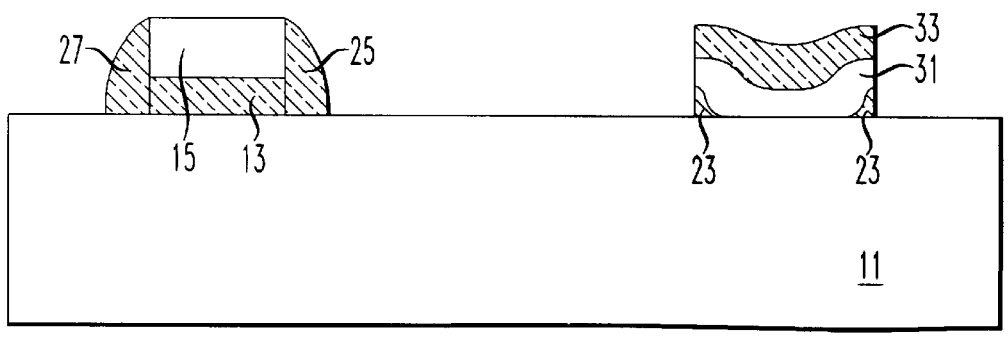

FIGS. 5 and 6 depict an illustrative method of forming a polysilicon emitter. In FIG. 5, a blanket layer of silicon 31 or other suitable emitter material is deposited. Typically, layer 31 may be amorphous silicon formed from the decomposition of silane. Blanket layer 33, formed above layer 31, may be illustratively, silicon dioxide, typically formed from plasma-enhanced TEOS. Reference numeral 35 denotes a patterned photoresist.

Layer 33 is an anisotropically etched using patterned photoresist 35 as a mask. Layer 33, after it has been patterned, is often termed "a hard mask oxide." The use of a hard mask oxide 33 prevents damage to the corners of silicon layer 31. However, layer 33 may be completely omitted and layer 31 patterned only with the use of an overlying patterned photoresist, at this time.

Anisotropic etching of layers 33 and 31 also serves to fully define spacers 25 and 27 adjacent gates 17.

Thus, it is seen in FIG. 6, that emitter 31 has been defined with overlying oxide layer 33 and adjacent oxide layer 23. Furthermore, spacers 25 and 27 have been fully formed adjacent gate 17.

Conventional BiCMOS processing may take place at this point. Such conventional processing includes deposition of a blanket dielectric, opening of windows in the dielectric, and deposition of conductive contacts.

Figure 7:
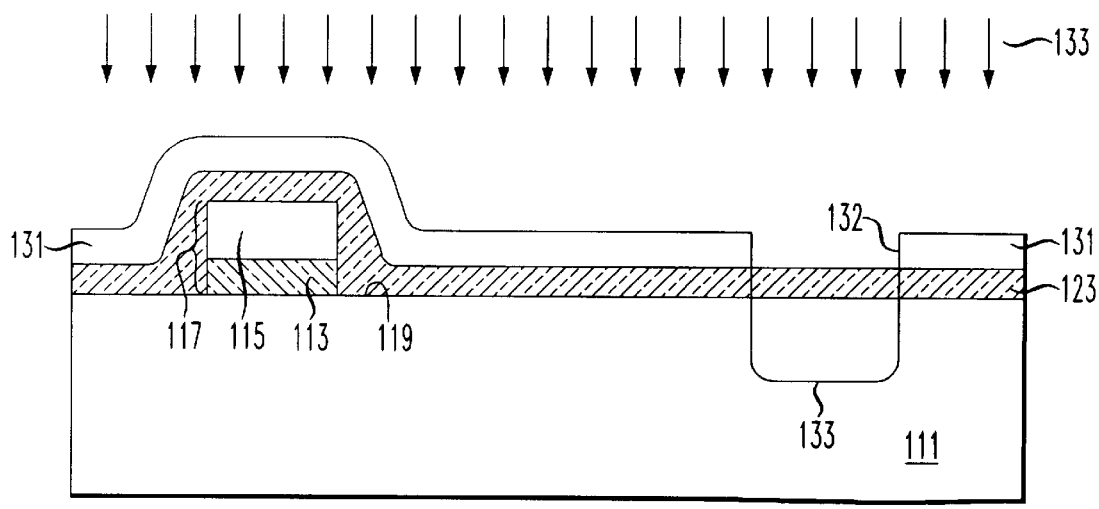

Another embodiment of the invention is depicted in FIGS. 7–10. In FIG. 7, reference numeral 11 denotes a substrate which may be typically, silicon, doped silicon, epitaxial silicon, etc. It is also assumed in FIG. 7 that the appropriate field oxides or other isolation structures have already been formed (although they are not shown). Such isolations may serve, for example, to separate n-wells and p-wells for NMOS and PMOS devices and/or separate the to-be-formed bipolar devices.

Gate 117 having conductor 115 an underlying gate dielectric 113 is defined by methods known to those of skill in the art. (As before, there may be a small thickness of gate dielectric material which remains upon upper surface 119 of the substrate 111 not shown.)

A blanket layer of dielectric 123 has been deposited. Illustratively, dielectric 123 may be an oxide of silicon, illustratively formed from TEOS or plasma enhanced TEOS. Again, a thickness of nominally 1600 Å for dielectric 123 is illustratively suitable. Dielectric 123 should have the thickness adequate for forming spacers adjacent gate 117. Thus, one of ordinary skill in the art may choose other thicknesses for dielectric 123 depending upon the height of gate 117.

In FIG. 7, dielectric 123 has been partially etched back by a blanket anisotropic plasma etch. Illustratively, should the initial thickness of dielectric 123 be approximately 1600 Å, approximately 1000 Å of dielectric may be removed by an anisotropic etch leaving nominally 600 Å of dielectric which is denoted by reference numeral 123. The anisotropic etching process partially forms spacers adjacent gate 117.

Layer 131 of, illustratively, amorphous silicon is deposited above layer 123. Illustratively, the thickness of layer 131 may be approximately 600 Å. FIG. 7 shows that layer 131 as been patterned and etched, thereby creating window opening 132. Next, an emitter ion implantation utilizing ionic species 133 is performed through dielectric 123 to create emitter region 133. (Previous formation of base and collector is not shown.)

Figure 8:
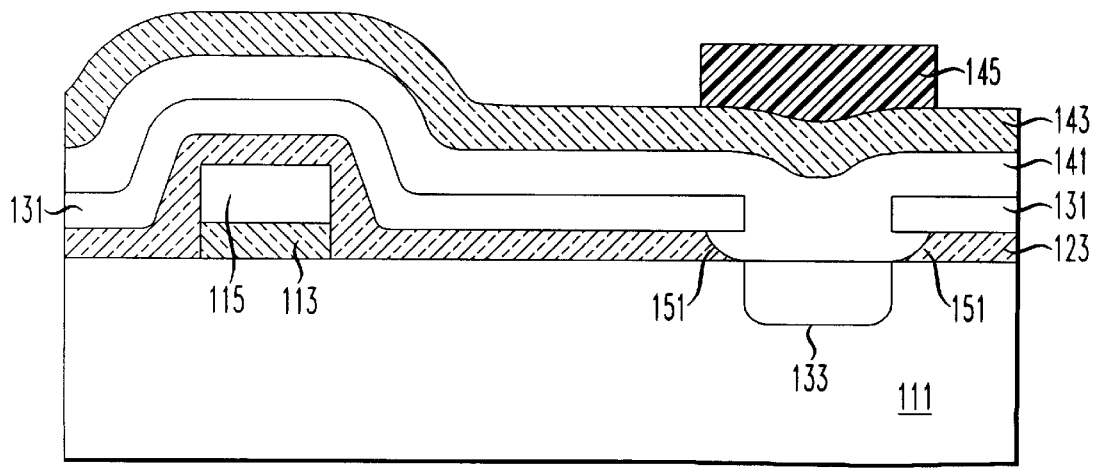

Turning to FIG. 8, layer 123 is isotropically etched typically with a wet etch. The isotropic etching process creates characteristicly curved sides 151 in layer 123. Next, approximately 2500 Å of polysilicon is blanket deposited (although other appropriate conductors may be chosen) followed by a suitable thickness of hard mask material 143. Other thicknesses of polysilicon may be chosen. Layer 143 may illustratively be plasma enhanced TEOS. A patterned photoresist 145 is formed above hard mask 143.

Figure 9:
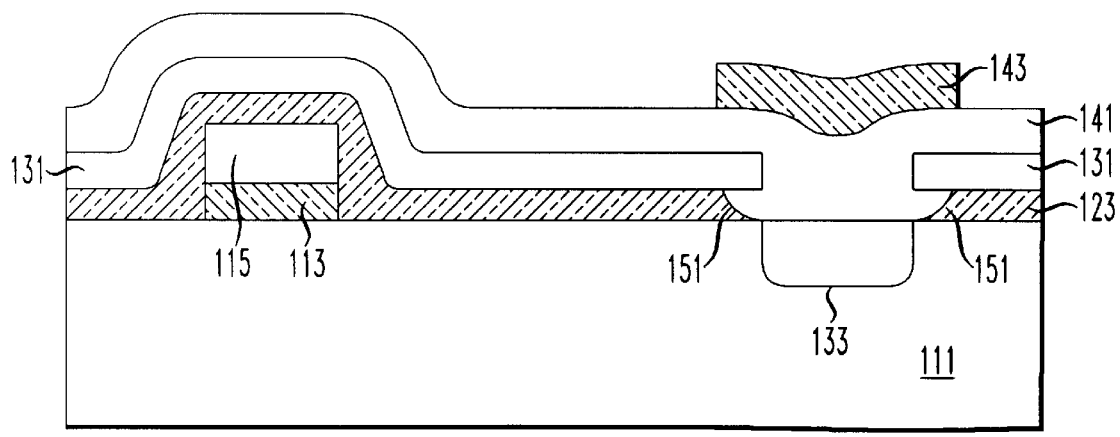

Turning to FIG. 9, hard mask layer 143 has been patterned utilizing photoresist 145 which subsequently removed.

Figure 10:
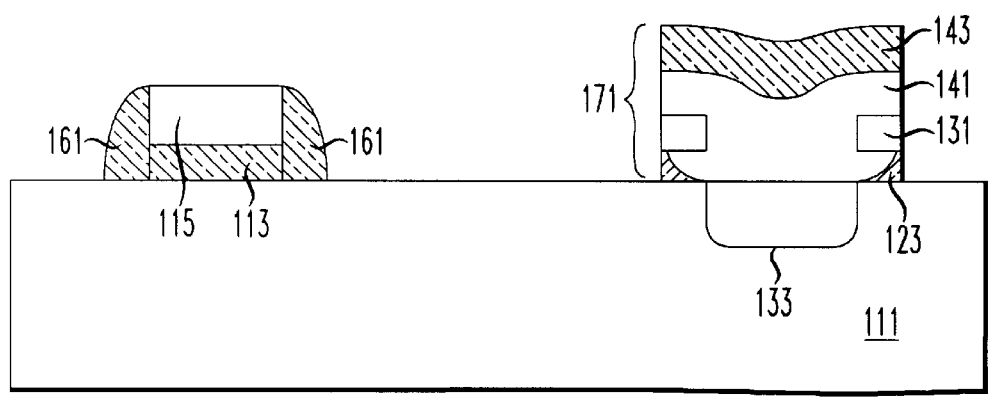

In FIG. 10, an anisotropic plasma etching process is performed to complete the definition of gate spacers 161 and to define emitter window 171 using patterned hard mask 143. (Other masking techniques may also be used.) Again, conventional processing, as mentioned before, may take place at this point.

The inventive process has thus achieved a plasma damage-free emitter window while maintaining spacer formation compatible with core CMOS technology.

The invention claimed is:

1. A method of forming an integrated circuit comprising:

forming a gate upon a substrate;

forming a blanket dielectric layer upon said gate and said substrate;

performing a blanket anisotropic etching process upon said dielectric layer, thereby removing a portion of said dielectric layer;

forming a patterned resist upon said dielectric;

isotropically etching said dielectric using said patterned resist as a mask, thereby exposing said substrate.

2. The method of claim 1 further including the step of forming a layer of patterned amorphous silicon between said blanket anisotropic etching step and said patterned resist formation step.

3. The method of claim 2 further including the step of forming an emitter region by ion implantation through said layer of patterned amorphous silicon.

4. The method of claim 3 including the step of depositing a conductive layer over said layer of amorphous silicon after said isotropic etching step.

5. The method of claim 4 further including the formation of a mask over said conductive layer, said mask being generally over said emitter region.

6. The method of claim 5 further including an anisotropic etching of said conductive layer, said amorphous silicon layer and said dielectric.

* * * * *